United States Patent [19]

Roche et al.

[11] Patent Number: 4,895,617

[45] Date of Patent: Jan. 23, 1990

[54] ETCHANT SOLUTION FOR PHOTORESIST-PATTERNED METAL LAYERS

[75] Inventors: Thomas S. Roche; Maureen F. Preuss, both of Cheshire, Conn.

[73] Assignee: Olin Corporation, Cheshire, Conn.

[21] Appl. No.: 347,128

[22] Filed: May 4, 1989

[51] Int. Cl.$^4$ .................... C23F 1/00; C23F 1/02; B44C 1/22; C03C 15/00
[52] U.S. Cl. .................... 156/665; 156/656; 156/659.1; 252/79.2; 252/79.4
[58] Field of Search .................... 252/79.2, 79.4, 142, 252/148; 156/656, 659.1, 665

[56] References Cited

U.S. PATENT DOCUMENTS 4,230,522 10/1980 Martin et al. .................... 156/638

OTHER PUBLICATIONS

Hara et al., "Anisotropic Wet Etching of Aluminum Electrodes by an Evacuated Etching System", Journal of the Electrochemical Society; (12/85) P. 2973–2975.

Akzo Chemical Inc., Product brochure for Aromox Amine Oxides (Copyright 1982).
Product brochure for Varox 365 (Jul. 25, 1978).

*Primary Examiner*—William A. Powell
*Attorney, Agent, or Firm*—W. A. Simons

[57] ABSTRACT

An etchant solution comprised of water and:
(a) about 65% to 75% by weight phosphoric acid;
(b) about 1% to 5% by weight nitric acid;
(c) about 0% to 15% by weight acetic acid; and
(d) about 0.005% to about 5% of an amine oxide surfactant having the formula (I):

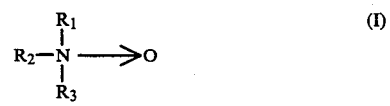

wherein $R_1$ and $R_2$ are each independently selected from the group consisting of lower alkyl group having 1–4 carbon atoms and lower alkoxy groups having 1–4 carbon atoms and $R_3$ is a higher alkyl group having 8 to 18 carbon atoms or a mixture thereof.

10 Claims, No Drawings

ETCHANT SOLUTION FOR PHOTORESIST-PATTERNED METAL LAYERS

The present invention relates to etchant solutions for photoresist-patterned metal layers. More particularly, this invention relates to aqueous etchant solutions containing a mixture of water, phosphoric acid, nitric acid, acetic acid and selected higher trialkyl amine oxide surfactants which are used to etch metal(e.g. aluminum) substrates used in the manufacture of integrated circuits.

The delineation of patterns in metal layers on wafers in the fabrication of integrated circuits is typically carried out by forming a patterned photoresist layer on the metal surface and then etching the exposed patterned metal layer with a metal dissolving etchant solution. These etchant solutions operate by simultaneously causing the oxidation of the metal to a soluble species and the reduction of hydrogen ions in the solution. The latter results in the generation of hydrogen gas at the surface of the metal. This hydrogen gas generated at the surface tends to remain on the surface and may mask the metal itself, thus preventing the access of the etchant solution to the metal surface. Therefore, areas of the metal may remain unetched which may form undesirable short circuits.

This gas generation problem has in the past been overcome in semiconductor fabrication by periodically removing the wafers from the etchant solution during the etching to allow the bubbles to detach themselves from the metal surface. This is not always successful as the bubbles tend to cling to the photoresist layer and the exposed metal surface of the wafers. Alternatively in the past, the wafer was overetched, i.e. etched for a time exceeding that normally necessary to remove the metal film present, thereby allowing for the possible imperfect etching described above to be overcome. However, overetching causes a problem when very small photoresist mask lines are present on the metal surface. In such cases, the etchant may dissolve the metal under the areas mashed by the photoresist (also called undercutting), resulting of the thinning of the lines and increased electrical resistance.

The object of this invention is to provide an etching solution which will etch metal layers, especially aluminum layers, in a manner that allows the bubbles formed on the metal surface to escape from the surface quickly and thus allow the entire metal surface to be etched uniformly without the formation of etch defects. As a result, the metal layers will not have to be subjected to overetching which can cause thinning of the metal lines produced. In addition, the wafer does not have to be periodically removed from the bath during the etch as described above, so the etching process may be quicker, under better control and with less labor involved. Accordingly, the present invention is directed to an aqueous etchant solution comprising water and:

(a) about 65% to 75% by weight phosphoric acid;
(b) about 1% to 5% by weight nitric acid;
(c) about 0% to 15% by weight acetic acid; and
(d) about 0.005% to about 5% of an amine oxide surfactant having the formula (I)

wherein $R_1$ and $R_2$ are independently selected from the group consisting of a lower alkyl group having 1 to 4 carbon atoms and lower alkoxy group having 1 to 4 carbon atoms and $R_3$ is a higher alkyl group having 8 to 18 carbon atoms or a mixture thereof.

Moreover, the present invention is directed to a process for etching a photoresist-patterned metal substrate (e.g. aluminum) which comprises immersing the metal substrate in an aqueous etchant solution of the above composition.

The etchant solutions of the present invention may be made up by adding the trialkyl amine oxide compound of formula (I) to known metal etchants made up of water, phosphoric acid, nitric acid and optionally, acetic acid.

One suitable known metal etchant solution containing these three acids is M2S etch available from Image Technology Inc. of Tempe, Ariz. This known metal etchant contains about 72% by weight phosphoric acid, 2% by weight nitric acid and 10% by weight acetic acid with the remainder water. Other suitable metal etchants containing the above-noted percentages of phosphoric acid and nitric acid may be also used as a starting material for the etchant solution of the present invention. Acetic acid is an optional additional ingredient.

The trialkyl amine oxide surfactants employed in the present invention include dimethyl cocoamine oxide ($R_1 = R_2 =$ methyl and $R_3$ is a mixture of $C_8$ to $C_{18}$ alkyls with the majority being $C_{12}$) which is sold as Aromox DMC-W by Akzo Chemicals Inc. of Chicago, Ill.; diethoxy cocoamine oxide ($R_1 = R_2 = $ 2-hydroxyethyl or ethoxy and $R_3$ is a mixture of $C_8$ to $C_{18}$ alkyls with the majority being $C_{12}$) which is sold as Aromox C/12-W by Akzo Chemical Inc. of Chicago, Ill.; and dimethyl laurylamine oxide ($R_1 = R_2 = $ methyl and $R_3$ is 95% by weight $C_{12}$) sold as Varox 365 by Sherex Chemical Company, Inc., Dublin, Ohio. Preferably, $R_1$ and $R_2$ are methyl, ethyl, methoxy and ethoxy. $R_3$ is preferably a mixture of $C_8$–$C_{18}$ alkyls having a majority of $C_{10}$ to $C_{14}$ alkyls.

Other trialkyl amine oxides besides the three specific ones noted above would be expected to be effective from this metal etching application. It has been found that trialkyl amine oxides, unlike most other surfactants, are stable in this highly acidic and oxidizing environment.

The operative, preferred and most preferred percentage by weight ranges of the five principal ingredients of the present invention are as follows:

| Ingredient | Operative Range | Preferred Range | Most Preferred Range |
|---|---|---|---|
| phosphoric acid | 65–75% | 68–74% | 71–73% |
| nitric acid | 1–5% | 1.25–4% | 1.5–2.5% |
| acetic acid | 0–15% | 6–14% | 8–12% |
| trialkyl amine oxide | 0.005–5% | 0.02–0.5% | 0.05–0.15% |
| water | remainder | remainder | remainder |

The following examples and comparisons are provided to better illustrate the present invention. All parts and percentages are by weight unless explicitly stated otherwise.

COMPARISON 1

M2S Etch aluminum etchant contains about 72% by weight phosphoric acid, 2% by weight nitric acid, 10% by weight acetic acid and the remainder water.

EXAMPLE 1

To 500 grams of M2S Etch aluminum etchant containing 72% phosphoric acid, 2% nitric acid, 10% acetic acid and the remainder water was added 0.5 grams of a dimethyl cocoamine oxide surfactant.

EXAMPLE 2

To 500 grams of M2S Etch aluminum etchant containing about 72% phosphoric acid, 2% nitric acid, 10% acetic acid and the remainder water was added 0.5 grams of a diethoxy cocoamine oxide surfactant.

EXAMPLE 3

To 500 grams M2S Etch aluminum etchant containing about 72% phosphoric acid, 2% nitric acid, 10% acetic acid and the remainder water was added 0.5 grams of dimethyl laurylamine oxide surfactant.

COMPARISON 2

To 500 grams of M2S Etch aluminum etchant containing about 72% phosphoric acid, 2% nitric acid, 10% acetic acid and the remainder water was added 0.5 grams of dimethyl tallowamine surfactant.

COMPARISON 3

To 500 grams of M2S Etch aluminum etchant containing about 72% phosphoric acid, 2% nitric acid, 10% acetic acid and the remainder water was added 0.5 grams of a nonylphenol glycidol ether surfactant.

EXAMPLE 4

To 500 grams of M2S Etch aluminum etchant containing about 72% phosphoric acid, 2% nitric acid, 10% acetic acid and the remainder water wad added 0.25 grams of dimethyl cocoamine oxide surfactant.

SOLUBILITY AND STABILITY STUDIES

Solubility of a surfactant in the etchant solution is an important factor since insoluble surfactants would tend to be filtered out when the solution is filtered to remove particles from the solution.

The surface tension of the solution of Example 4 was determined and the solution was then circulated through a 0.2 micron teflon filter for six hours at a rate equal to approximately one complete turnover of the solution per minute. After approximately 360 turnovers, the surface tension was again determined and it was found to be the same as that determined before filtration was begun. This indicates that the concentration of the surfactant of Example 4 was not significantly decreased by this filtration and the surfactant is soluble in this medium.

The solutions of all of the above examples and comparisons except Example 4 were heated to 50° C. on a water bath in a Teflon beaker. The solutions of Examples 1, 2, and 3 and Comparison 1 showed little change in color over 5 days at this temperature. The solutions of Comparisons 2 and 3 showed color changes within one hour at this temperature indicating decomposition of the surfactant. The surface tension of the solution of Example 3 was tested before and after this experiment. The surface tension was the same after heating for 5 days.

ETCHING ABILITY EXPERIMENTS

The ability of the surfactant to promote complete etching is the most important factor to be considered in choosing a surfactant to use in this application. To test the ability of a surfactant to promote the patterned etching of aluminum coated wafers, wafers were obtained which had an approximately 1 micron thick layer of either pure aluminum or an alloy of aluminum and silicon containing 1% by weight silicon over silicon dioxide which has been grown on the underlying silicon. These wafers were patterned using a positive-working photoresist[4] exposed through a mask containing a variety of greater than 1 micron size pattern of lines and spaces. The wafers were then etched to an end point visually determined by the loss of the reflective aluminum metal in the holes being etched and the appearance of the dark color of the oxide film beneath the metal layer. The films were not overetched.

[4] WAYCOAT HPR-204 positive-working photoresist available from Olin Hunt Specialty Products Inc. of West Paterson, N.J.

COMPARISON 4

A wafer coated with a pure aluminum layer was patterned with the photoresist. The wafer was then etched at 50° C. until completion in an unstirred solution of Comparison 1. After etching, the wafer was examined on the microscope for defects.

COMPARISON 5

A wafer coated with a pure aluminum layer was patterned with the photoresist. The wafer was then etched at 50° C. until completion in a stirred solution of Comparison 1. After etching, the wafer was examined on the microscope for defects.

EXAMPLE 5

A wafer coated with a pure aluminum layer was patterned with the photoresist. The wafer was then etched at 50° C. until completion in an unstirred solution of Example 4. After etching, the wafer was examined on the microscope for defects.

EXAMPLE 6

A wafer coated with a pure aluminum layer was patterned with the photoresist. The wafer was then etched at 50° C. until completion in a stirred solution of Example 4. After etching, the wafer was examined on the microscope for defects.

EXAMPLE 7

A wafer coated with a 1% alloy of silicon in aluminum was patterned with a photoresist. The wafer was then etched at 35° C. until completion in a stirred solution of Example 3. After etching, the wafer was examined on the microscope for defects.

EXAMPLE 8

A wafer coated with a 1% alloy of silicon in aluminum was patterned with a photoresist. The wafer was then etched at 35° C. until completion in a stirred solution of Example 2. After etching, the wafer was examined on the microscope for defects.

For each examination, the percentage of patterns containing defects were noted. These results are noted in the table below.

TABLE 1

| Etchant Composition | Example or Comparison | Conditions | % Defects |
|---|---|---|---|
| C-1 | C-4 | No Surfactant, not stirred | 76 |
| C-1 | C-5 | No Surfactant, stirred | 40 |
| 4 | 5 | 0.05% Surfactant, not stirred | 0 |
| 4 | 6 | 0.05% Surfactant, stirred | 0 |
| 3 | 7 | 0.1% Surfactant, stirred | 0 |
| 2 | 8 | 0.1% Surfactant, stirred | 0 |

As the results show, the presence of the selected surfactants of this invention result in a significant decrease in the number of defects in a patterned etch of the metal layer.

What is claimed is:

1. An etchant solution comprised of water and:
   (a) about 65% to 75% by weight phosphoric acid;
   (b) about 1% to 5% by weight nitric acid;
   (c) about 0% to 15% by weight acetic acid; and
   (d) about 0.005% to about 5% of an amine oxide surfactant having the formula (I):

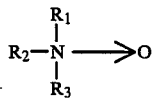
(I)

wherein $R_1$ and $R_2$ are each independently selected from the group consisting of lower alkyl group having 1-4 carbon atoms and lower alkoxy groups having 1-4 carbon atoms and $R_3$ is a higher alkyl group having 8 to 18 carbon atoms or a mixture thereof.

2. The etchant solution of claim 1 wherein said surfactant is present in a concentration from about 0.02% to about 0.5% by weight of the etchant solution.

3. The etchant solution of claim 1 wherein said phosphoric acid is present in a concentration from about 68% to about 74% by weight of the etchant solution.

4. The etchant solution of claim 1 wherein said nitric acid is present in a concentration of about 1.25% to about 4% by weight of said etchant solution.

5. The etchant solution of claim 1 wherein said acetic acid is present in a concentration from about 6% to about 14% by weight of the etchant solution.

6. The etchant solution of claim 1 wherein $R_1$ and $R_2$ are selected from the group consisting of methyl, methoxy, ethyl and ethoxy.

7. The etchant solution of claim 1 wherein $R_3$ is a mixture of $C_8$ to $C_{18}$ alkyls of which a majority are $C_{10}$ to $C_{14}$ alkyls.

8. An etchant solution comprised of water and:
   (a) about 68% to 74% by weight phosphoric acid;
   (b) about 1.25% to 4% by weight nitric acid;
   (c) about 6% to 14% by weight acetic acid; and
   (d) about 0.02% to about 0.5% by weight of trialkyl amine oxide surfactant having the formula (I):

(I)

wherein R and $R_2$ are independently selected from the group consisting of methyl, methoxy, ethyl and ethoxy and $R_3$ is a mixture of $C_8$ to $C_{18}$ alkyls of which a majority are $C_{10}$ to $C_{14}$ alkyls.

9. A process for etching a metal substrate which comprises immersing the substrate in an aqueous etchant solution comprised of water and:
   (a) about 65% to 75% by weight phosphoric acid;
   (b) about 1% to 5% by weight nitric acid;
   (c) about 0% to 15% by weight acetic acid; and
   (d) about 0.005% to about 5% of an amine oxide surfactant having the formula (I):

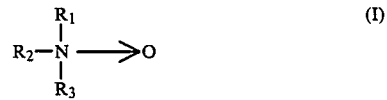
(I)

wherein $R_1$ and $R_2$ are each independently selected from the group consisting of lower alkyl group having 1-4 carbon atoms and lower alkoxy groups having 1-4 carbon atoms and $R_3$ is a higher alkyl group having about 8 to 18 carbon atoms or mixture thereof.

10. The process of claim 9 wherein the substrate is aluminum.

* * * * *